(12) United States Patent
Liu et al.

(10) Patent No.: US 11,532,551 B2
(45) Date of Patent: Dec. 20, 2022

(54) SEMICONDUCTOR PACKAGE WITH CHAMFERED SEMICONDUCTOR DEVICE

(71) Applicant: Taiwan Semiconductor Manufacturing Co., Ltd., Hsinchu (TW)

(72) Inventors: Chung-Shi Liu, Hsinchu (TW);
Ching-Hua Hsieh, Hsinchu (TW);
Chen-Hua Yu, Hsinchu (TW);
Hsin-Hung Liao, Taipei (TW);
Chien-Ling Hwang, Hsinchu (TW);
Sung-Yueh Wu, Chiayi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 150 days.

(21) Appl. No.: 16/231,614

(22) Filed: Dec. 24, 2018

(65) Prior Publication Data
US 2020/0203270 A1    Jun. 25, 2020

(51) Int. Cl.
*H01L 23/02*    (2006.01)
*H01L 23/528*    (2006.01)
(Continued)

(52) U.S. Cl.
CPC .......... *H01L 23/528* (2013.01); *H01L 21/563* (2013.01); *H01L 23/3128* (2013.01);
(Continued)

(58) Field of Classification Search
CPC ... H01L 21/563; H01L 23/3128; H01L 24/09; H01L 24/17; H01L 24/73; H01L 24/97; H01L 23/488; H01L 23/49838; H01L 23/29; H01L 23/3164; H01L 31/0481; H01L 31/0488; H01L 33/56; H01L 2225/06513; H01L 2225/06517; H01L 23/528; H01L 2224/02373; H01L 2224/0401; H01L 23/64; H01L 24/19; H01L 24/20; H01L 24/16; H01L 24/29; H01L 24/32; H01L 2224/04105; H01L 2224/12105; H01L 2224/16227; H01L 2224/18; H01L 2224/2919; H01L 2224/32225; H01L 2224/73204; H01L 2224/83102; H01L 2224/92144; H01L 2924/10156; H01L 2924/15311; H01L 2924/181; H01L 2924/19105; H01L 21/78;
(Continued)

(56) References Cited

U.S. PATENT DOCUMENTS

2004/0145040 A1* 7/2004 Fukuda ............... H01L 24/97
257/687
2008/0009102 A1* 1/2008 Yang .................. H01L 21/568
438/126
(Continued)

*Primary Examiner* — Caleb E Henry
*Assistant Examiner* — Dilinh P Nguyen
(74) *Attorney, Agent, or Firm* — JCIPRNET (57) ABSTRACT

A semiconductor package includes a semiconductor device, an encapsulating material, and a redistribution structure. The semiconductor device includes a chamfer disposed on one of a plurality of side surfaces of the semiconductor device. The encapsulating material encapsulates the semiconductor device. The redistribution structure is disposed over the encapsulating material and electrically connected to the semiconductor device.

20 Claims, 7 Drawing Sheets

(51) Int. Cl.
  *H01L 23/00*   (2006.01)
  *H01L 23/31*   (2006.01)
  *H01L 21/56*   (2006.01)

(52) U.S. Cl.
  CPC .............. *H01L 24/09* (2013.01); *H01L 24/17* (2013.01); *H01L 24/73* (2013.01); *H01L 24/97* (2013.01); *H01L 2224/02373* (2013.01); *H01L 2224/0401* (2013.01)

(58) Field of Classification Search
  CPC ........... H01L 23/4006; H01L 23/49816; H01L 23/5389; H01L 25/16; H01L 29/0657; H01L 23/315
  USPC ................................. 257/678, 778, 786, 788
  See application file for complete search history.

(56) References Cited

U.S. PATENT DOCUMENTS

| | | | |
|---|---|---|---|
| 2009/0096076 A1* | 4/2009 | Jung ................... | H01L 25/0657 257/686 |
| 2012/0273872 A1* | 11/2012 | Lim .................... | H01L 27/0688 257/E27.06 |
| 2014/0001487 A1* | 1/2014 | Nakazawa ........ | H01L 29/66068 438/137 |
| 2015/0214077 A1* | 7/2015 | Tsai .................... | H01L 23/3114 257/737 |
| 2017/0287853 A1* | 10/2017 | Kim .................. | H01L 23/49822 |
| 2019/0148254 A1* | 5/2019 | Na ...................... | H01L 23/5226 257/774 |

\* cited by examiner

FIG. 14

SEMICONDUCTOR PACKAGE WITH CHAMFERED SEMICONDUCTOR DEVICE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
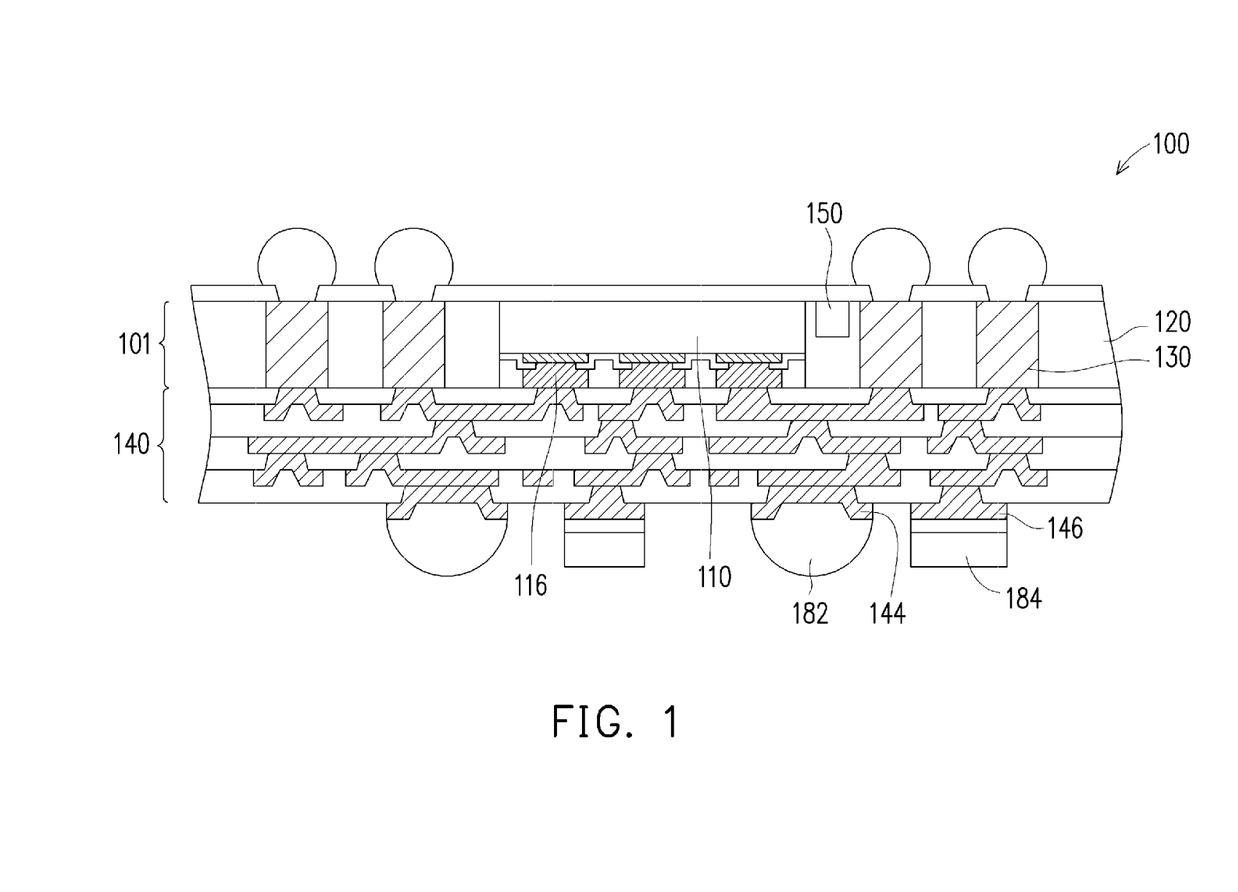
FIG. 1 illustrates a schematic cross sectional view of a semiconductor package in accordance with some embodiments.
Figure 2:
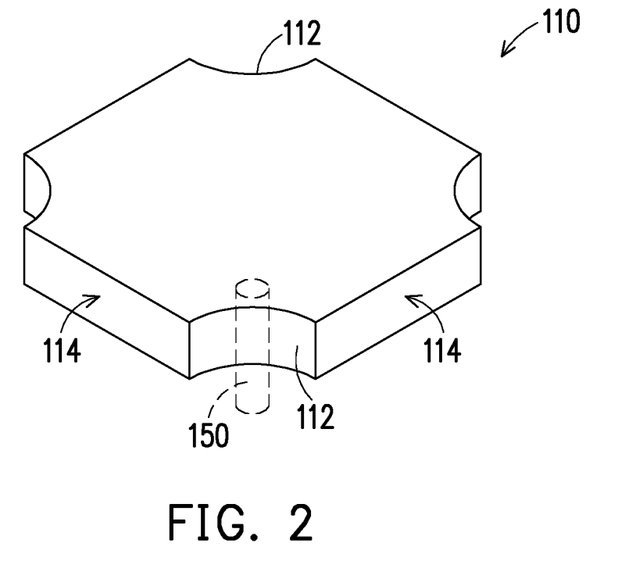
FIG. 2 illustrates a schematic view of a semiconductor device in accordance with some embodiments.

FIG. 1 illustrates a schematic cross sectional view of a semiconductor package in accordance with some embodiments. FIG. 2 illustrates a schematic view of a semiconductor device in accordance with some embodiments. With reference to FIG. 1 and FIG. 2, in some embodiments, a semiconductor package 100 includes a semiconductor device 110, an encapsulating material 120, and a redistribution structure 140. In accordance with some embodiments of the disclosure, the semiconductor device 110 includes at least one chamfer 112 (four chamfers 112 are illustrated herein, but are not limited thereto), which is disposed on at least one of a plurality of side surfaces 114 of the semiconductor device 110. In some embodiments, the semiconductor device 110 includes a plurality of chamfers 112 disposed on the corners of the semiconductor device 110 and connected between adjacent two of the side surfaces 114 of the semiconductor device 110. In general, the chamfer 112 is a transitional edge between two adjacent side surfaces of the semiconductor device 110. In one of the implementations, the chamfer 112 may be a concave (e.g. reverse rounding corner) located at the corner of the semiconductor device 110 and is dented toward a center of the semiconductor device 110.

Figure 3:
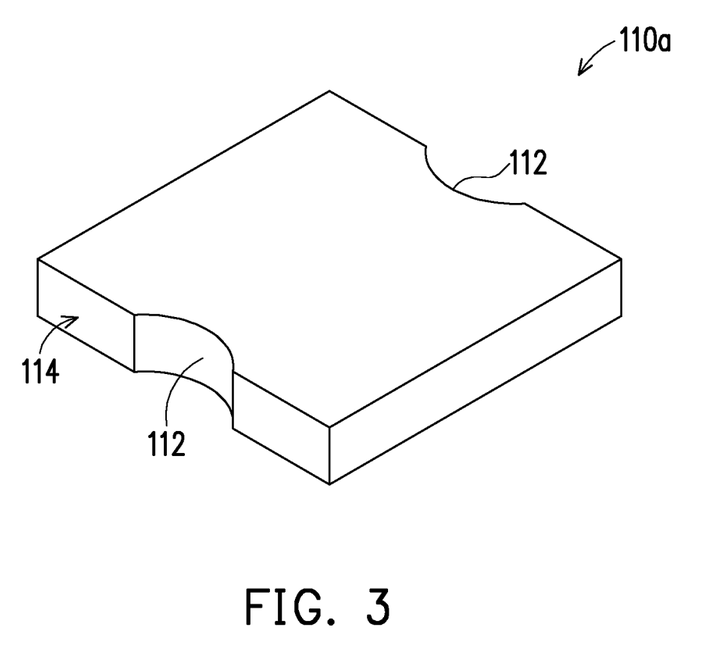
FIG. 3 illustrates a schematic view of a semiconductor device in accordance with some embodiments.

FIG. 3 illustrates a schematic view of a semiconductor device in accordance with some embodiments. With now reference to FIG. 3, in accordance with some embodiments of the disclosure, the semiconductor device 110a may include at least one chamfer 112 (two chamfers 112 are illustrated herein, but are not limited thereto), which is disposed on at least one side surfaces 114 of the semiconductor device 110a. In some embodiments, the chamfers 112 of the semiconductor device 110a may be concaves disposed on two side surfaces opposite to each other, but the disclosure is not limited thereto.

With now reference back to FIG. 1 and FIG. 2, in accordance with some embodiments of the disclosure, the semiconductor package 100 may further includes at least one electrical component 150, which is disposed on a side of the semiconductor device 110 and at least partially located in the chamfer (concave) 112. In some embodiments, the electrical component 150 may be a passive device such as a resistor, a capacitor, an inductor, etc., an electrical interconnect such as a conductive pillar or the like. In some embodiments, the electrical component 150 may be an optical device such as a microlens, an optical fiber, or any suitable devices.

In accordance with some embodiments of the disclosure, the encapsulating material 120 encapsulates the semiconductor device 110 with the chamfer 112. In the embodiments of the semiconductor package 100 with the electrical component 150 located in the chamfer 112, the encapsulating material 120 may also encapsulate the electrical component 150. In some embodiments, the encapsulating material 120 may be a single-layered encapsulating material, which may include a molding compound formed by a molding process. The material of the encapsulating material 120 may include epoxy or other suitable resins. For example, the encapsulating material 120 may be epoxy resin containing chemical filler.

In some embodiments, the semiconductor device 110 and the electrical component 150 may be firstly disposed on a carrier as the arrangement shown in FIG. 2. Then, the encapsulating material 120 may be formed over the carrier to encapsulate and cover the top surfaces of the semiconductor device 110 and the electrical component 150, so as to form an encapsulated semiconductor device on the carrier. Then, in some embodiments, the encapsulating material 120 is planarized to reveal at least the top surface of the semiconductor device 110. In some embodiments, the top surface of the electrical component 150 (e.g. the top surface of the conductive pillars) may also be revealed by the encapsulating material 120 through the planarizing process. In some embodiment, the top surface of the encapsulating material 120 are ground and polished until electrical terminals 116 of the semiconductor device 110 (and the top surface of the conductive pillars) are revealed. After the encapsulating material 120 is ground, an encapsulated semiconductor device 101 as shown in FIG. 1 is formed. The encapsulated semiconductor device 101 may have a wafer form in the process. Accordingly, a ground surface of the encapsulating material 120 is substantially coplanar with the electrical terminals 116 of the semiconductor device 110. In some embodiments, the planarizing process of the encapsulating material 120 may include mechanical grinding or chemical mechanical polishing (CMP), for example. After the planarizing process, a cleaning step may be optionally performed, for example, to clean and remove the residue generated from the grinding step. However, the disclosure is not limited thereto, and the planarizing step may be performed through any other suitable method.

In some embodiments, a redistribution structure 140 may be formed on the encapsulated semiconductor device 101. In some embodiments, the redistribution structure 140 is formed over the encapsulating material 120 and semiconductor device 110. The redistribution structure 140 is electrically connected to the electrical terminals 116 of the semiconductor device 110 and the electrical component 150. In some embodiments, a plurality of dielectric layers and a plurality of redistribution circuit layers may be stacked on top of one another alternately to form the redistribution structure 140 as shown in FIG. 1. The material of the dielectric layer of the redistribution structure 140 may include organic polymer such as, but not limited to, polyimide, etc. The material of the redistribution circuit layer may include copper, or any other suitable materials. Then, in some embodiments, an under bump metallization layer 144 and at least one connecting pad 146 are formed on the topmost redistribution circuit layer (illustrated as on the bottommost redistribution circuit layer due to the orientation of the semiconductor package 100 in FIG. 1). The under bump metallization layer 144 and the connecting pad 146 may be formed by sputtering, evaporation, or electroless plating, etc.

In some embodiments, at least one conductive bump 182 is formed on the under bump metallization layer 144, and at least one integrated passive device (IPD) 184 is formed on the connecting pad 146. The conductive bump 182 and the IPD 184 are electrically connected to the redistribution structure 140. The formation of the conductive bump 182 may include placing solder balls on the under bump metallization layer 144, and then reflowing the solder balls. In alternative embodiments, the formation of the conductive bump 182 may include performing a plating process to form solder regions on the under bump metallization layer 144, and then reflowing the solder regions. The conductive bump 182 may also include conductive pillars, or conductive pillars with solder caps, which may also be formed through plating. The IPD 184 may be fabricated using standard wafer fabrication technologies such as thin film and photolithography processing, and may be mounted on the connecting pad 146 through, for example, flip-chip bonding or wire bonding, etc.

With the configuration of the semiconductor device 110 having the chamfer 112, the electrical components 150 such as passive devices, electrical interconnects, optical devices, or any suitable components may be disposed on a side of the semiconductor device 110 and at least partially located in the chamfer 112. Thereby, the size of the semiconductor package 100 may be further reduced. In addition, the locations of the chamfers 112 may be regions for alignment marks or test keys, which are non-functional regions. That is to say, by removing the non-functional regions of the semiconductor device 110 to form the chamfer 112 for accommodating the electrical components 150, the space utilization of the semiconductor package 100 can be improved and the size of the semiconductor package 100 can be more compact.

Figure 4:
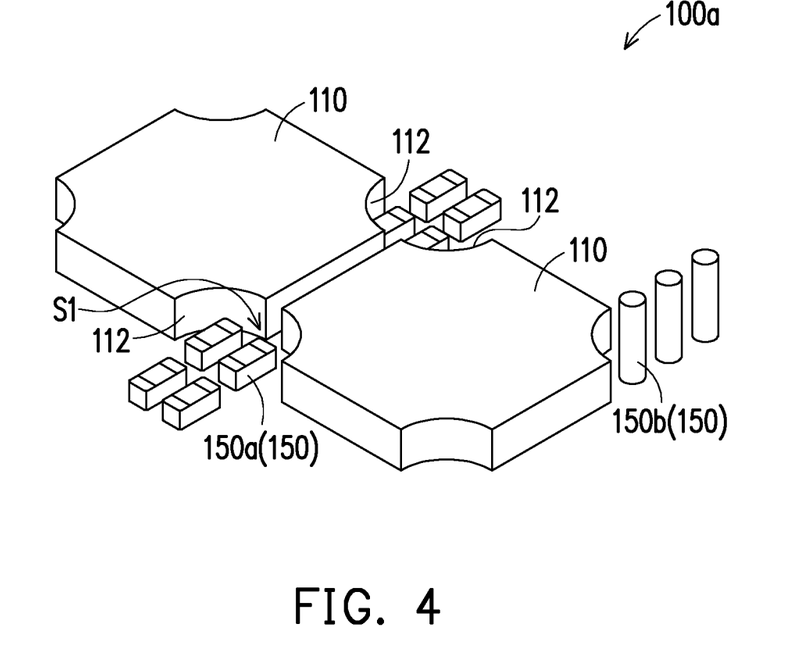
FIG. 4 illustrates a schematic view of a semiconductor package in accordance with some embodiments.
Figure 5:
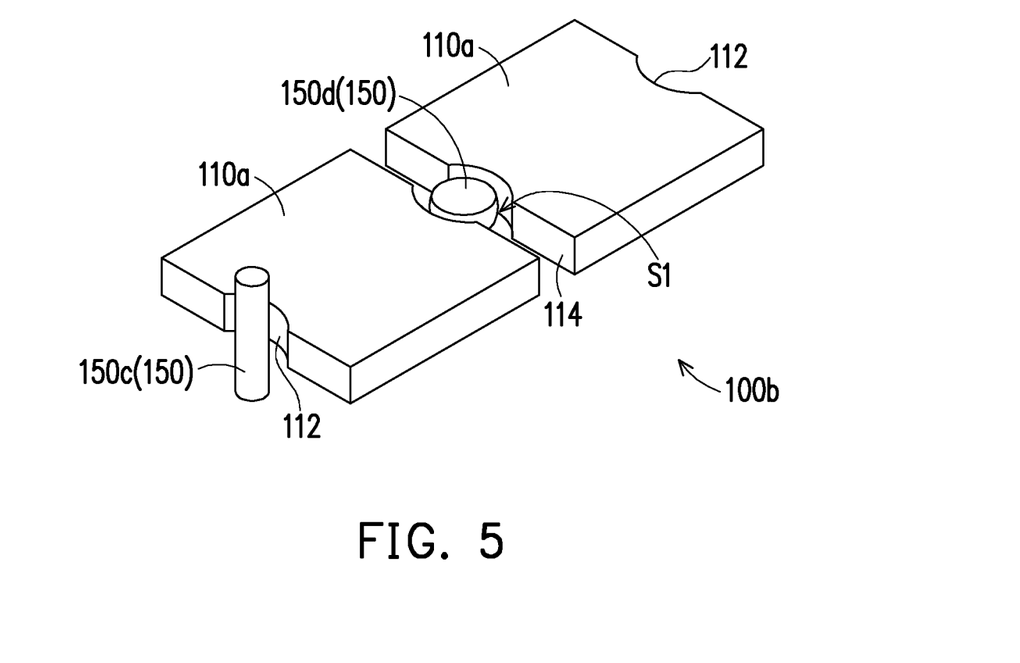
FIG. 5 illustrates a schematic view of a semiconductor package in accordance with some embodiments.

FIG. 4 illustrates a schematic view of a semiconductor package in accordance with some embodiments. FIG. 5 illustrates a schematic view of a semiconductor package in accordance with some embodiments. It is noted that the semiconductor packages 100a, 100b shown in FIG. 4 and FIG. 5 contain many features same as or similar to the semiconductor package 100 disclosed earlier with FIG. 1 and FIG. 2. For purpose of clarity and simplicity, detail description of same or similar features may be omitted, and the same or similar reference numbers denote the same or like components. The main differences between the semiconductor packages 100a, 100b shown in FIG. 4 and FIG. 5 and the semiconductor package 100 shown in FIG. 1 and FIG. 2 are described as follows. It is noted that, for the purpose of clarity and simplicity, the redistribution structure and the encapsulating material of the semiconductor package 100a, 100b are omitted in FIG. 4 and FIG. 5.

With now reference to FIG. 4 and FIG. 5, in accordance with some embodiments of the disclosure, the semiconductor package 100a/100b may include a plurality of semiconductor devices 110/110a (two semiconductor devices 110/110a are illustrated respectively in FIG. 4 and FIG. 5, but not limited thereto). In some embodiments, the semiconductor devices 110/110a are arranged in a side by side manner, and the chamfers (concaves) 112 of adjacent two of the semiconductor devices 110 are corresponding to each other, so as to jointly define a receiving space S1, and the electrical component 150 is disposed in the receiving space S1.

For example, in the embodiment shown in FIG. 4, the concaves 112 are disposed at the corners of each of the semiconductor devices 110. The concaves 112 located at the corners of the adjacent semiconductor devices 110 facing each other are aligned with each other, so that the concaves 112 facing each other jointly define the receiving space S1. The electrical components 150a, which are illustrated as, but are not limited to, passive devices, are at least partially disposed in the receiving space S1. The electrical components 150b, which are illustrated as, but are not limited to, conductive pillars, are at least partially disposed in the concave 112.

With now reference to FIG. 5, the concaves 112 are disposed at the side surfaces of each of the semiconductor devices 110a. The concaves 112 located at the side surfaces of the adjacent semiconductor devices 110a facing each other are aligned with each other, so that the concaves 112 facing each other jointly define the receiving space S1. The electrical component 150d, which is illustrated as, but is not limited to, a microlens, is disposed in the receiving space S1. The electrical component 150c, which is illustrated as, but is not limited to, an optical fiber, is disposed in the concave 112. The disclosure does not limit the form and the configuration of the chamfer (concave) 112 of the semiconductor device 110/110a as long as the electrical component 150 of the semiconductor package 100/100a/100b is at least partially disposed in the chamfer (concave) 112 for reducing the size of the semiconductor package 100/100a/100b.

Figure 6:
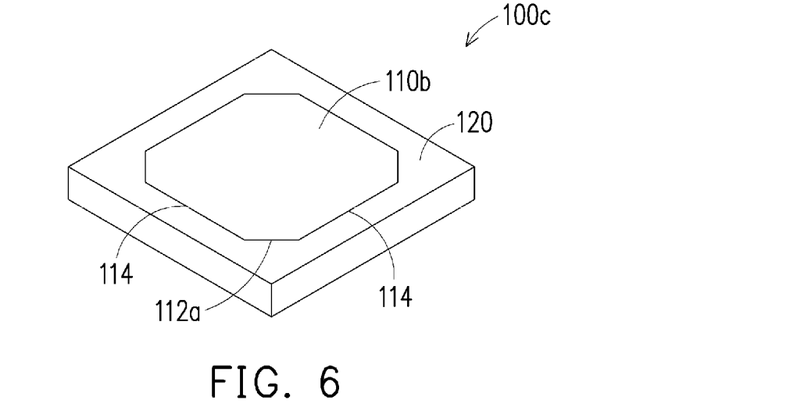
FIG. 6 illustrates a schematic view of a semiconductor package in accordance with some embodiments.
Figure 7:
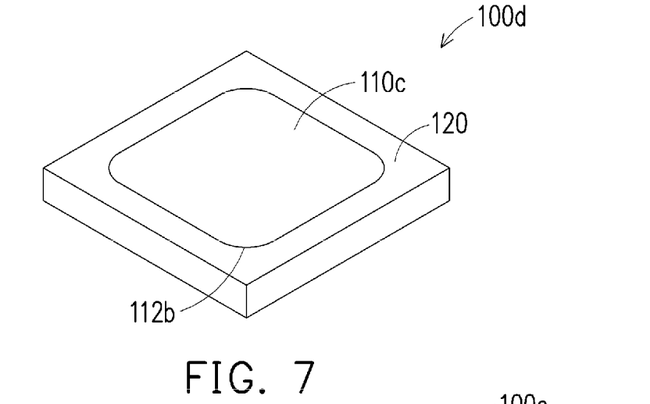
FIG. 7 illustrates a schematic view of a semiconductor package in accordance with some embodiments.

FIG. 6 illustrates a schematic view of a semiconductor package in accordance with some embodiments. FIG. 7 illustrates a schematic view of a semiconductor package in accordance with some embodiments. It is noted that the semiconductor packages 100c, 100d shown in FIG. 4 and FIG. 5 contain many features same as or similar to the semiconductor package 100 disclosed earlier with FIG. 1 and FIG. 2. For purpose of clarity and simplicity, detail description of same or similar features may be omitted, and the same or similar reference numbers denote the same or like components. The main differences between the semiconductor packages 100c, 100d shown in FIG. 6 and FIG. 7 and the semiconductor package 100 shown in FIG. 1 and FIG. 2 are described as follows. It is noted that, for the purpose of clarity and simplicity, the redistribution structure of the semiconductor package 100c, 100d are omitted in FIG. 6 and FIG. 7.

With now reference to FIG. 6, in accordance with some embodiments of the disclosure, the chamfer 112a may be a bevel corner connected between adjacent two of the plurality of side surfaces 114 of the semiconductor device 110b. In some embodiments, the chamfer 112a is a transitional edge between two adjacent side surfaces 114 of the semiconductor device 110b. In one of the implementations, the chamfer 112a is a form of bevel, which is created at 45° angle to two adjoining right-angled side surfaces 114. In some embodiments, the encapsulating material 120 encapsulates the chamfer 112a. The chamfer 112a is configured to ease otherwise sharp edges, which would results in stress concentration due to thermal mismatch between different materials (e.g. between the encapsulating material 120 and the semiconductor device 110b). Such stress usually mounts at the corners of the semiconductor device, and the chamfers 112a are configured to reduce or prevent such thermal stress issues encountered at the corners of the semiconductor device 110b. That is to say, the chamfers 112a are configured for stress relief at the corners of the semiconductor device 110b. Accordingly, yield and reliability of the semiconductor package 100c can be improved.

With now reference to FIG. 7, in accordance with some embodiments of the disclosure, the chamfer 112b may be a rounding corner connected between adjacent two of the plurality of side surfaces 114 of the semiconductor device 110c. In the present embodiment, the chamfer 112b is a form of a fillet, which is a rounding of an exterior corner of the semiconductor device 110c. The chamfer 112b may also be configured to ease otherwise sharp edges, which would results in stress concentration due to thermal mismatch between different materials. That is to say, the chamfers 112b may also provide stress relief at the corners of the semiconductor device 110c, so as to improve yield and reliability of the semiconductor package 100d.

Figure 8:
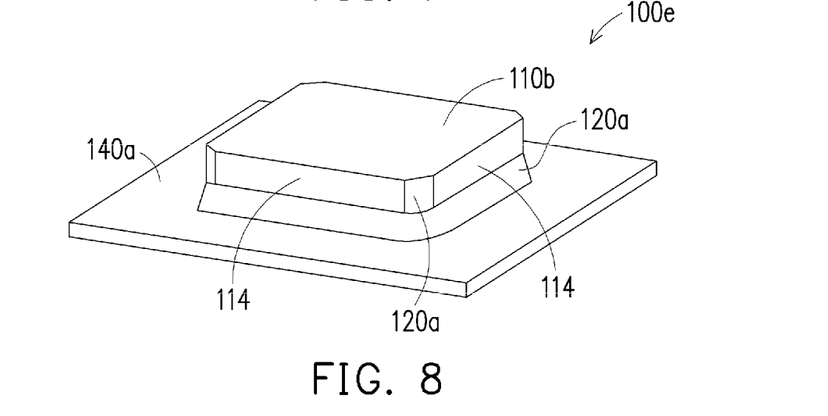
FIG. 8 illustrates a schematic view of a semiconductor package in accordance with some embodiments.

FIG. 8 illustrates a schematic view of a semiconductor package in accordance with some embodiments. It is noted that the semiconductor package 100e shown in FIG. 8 contains many features same as or similar to the semiconductor package 100c disclosed earlier with FIG. 6. For purpose of clarity and simplicity, detail description of same or similar features may be omitted, and the same or similar reference numbers denote the same or like components. The main differences between the semiconductor packages 100e shown in FIG. 8 and the semiconductor package 100c shown in FIG. 6 are described as follows.

With now reference to FIG. 8, in accordance with some embodiments of the disclosure, the redistribution structure 140a may be a (printed) circuit board, and the encapsulating material 120 may be an underfill encapsulating at least a part of the side surfaces 114 and filling between the semiconductor device 110b and the redistribution structure 140a. Namely, the semiconductor device 110b may be mounted on the redistribution structure 140a through flip chip bonding technique, for example. In other embodiments, the redistribution structure 140a may be a RDL structure, which includes at least one redistribution circuit layer and at least one of dielectric layer disposed alternately with each other. In some embodiments, the underfill 120a may include epoxy, for example, which is provided between the redistribution structure 140a and the semiconductor device 110b. The underfill 120a may be initially dispensed in liquid form from a dispenser onto the redistribution structure 140a, at one corner of the semiconductor device 110b. The underfill 120a is then drawn by capillary action between the redistribution structure 140a and the semiconductor device 110b. The cured underfill 120a attaches the semiconductor device 110b to the redistribution structure 140a and protects solder bumps (for flip chip bonding, for example) from cracking in the finished semiconductor package 100e.

Accordingly, the chamfers 112a are configured to ease otherwise sharp edges of at the corners of the semiconductor device 110b, which would result in stress concentration due to thermal mismatch between different materials (e.g. between the encapsulating material 120a, the semiconductor device 110b and the redistribution structure 140a). That is to say, the chamfers 112a are configured for stress relief at the corners of the semiconductor device 110b. Accordingly, yield and reliability of the semiconductor package 100e can be improved. It is noted that the chamfer 112 in a form of a bevel is illustrated in FIG. 8, but it should be understood that the chamfer 112b in a form of a fillet shown in FIG. 7 may also be applied to the semiconductor package 100e for stress relief.

Figure 9:
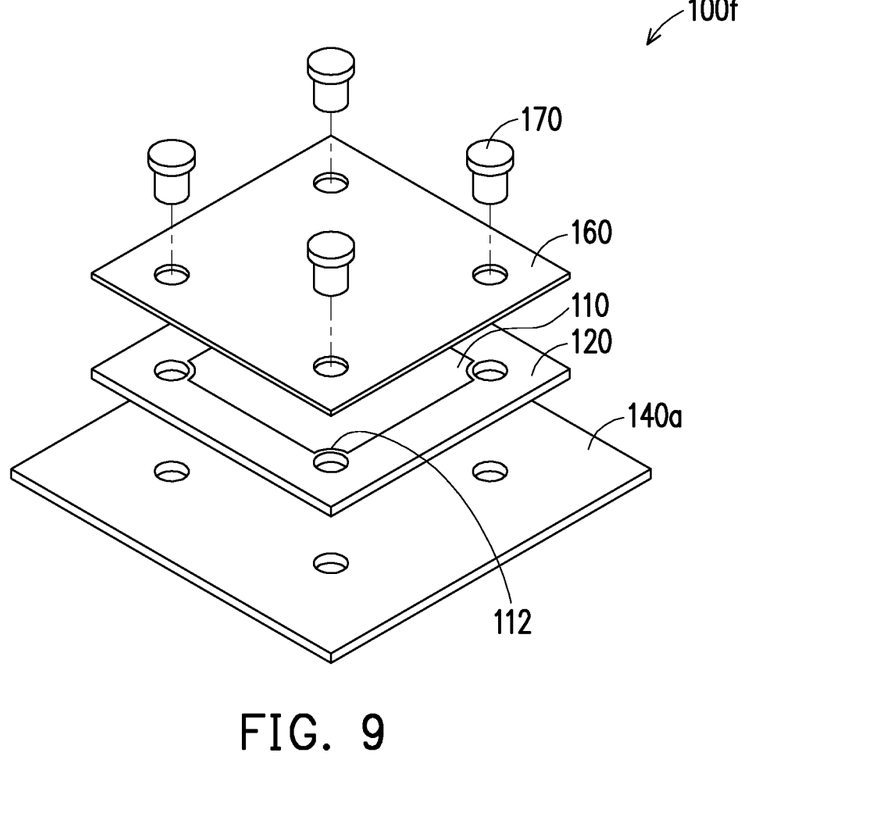
FIG. 9 illustrates a schematic exploded view of a semiconductor package in accordance with some embodiments.
Figure 10:
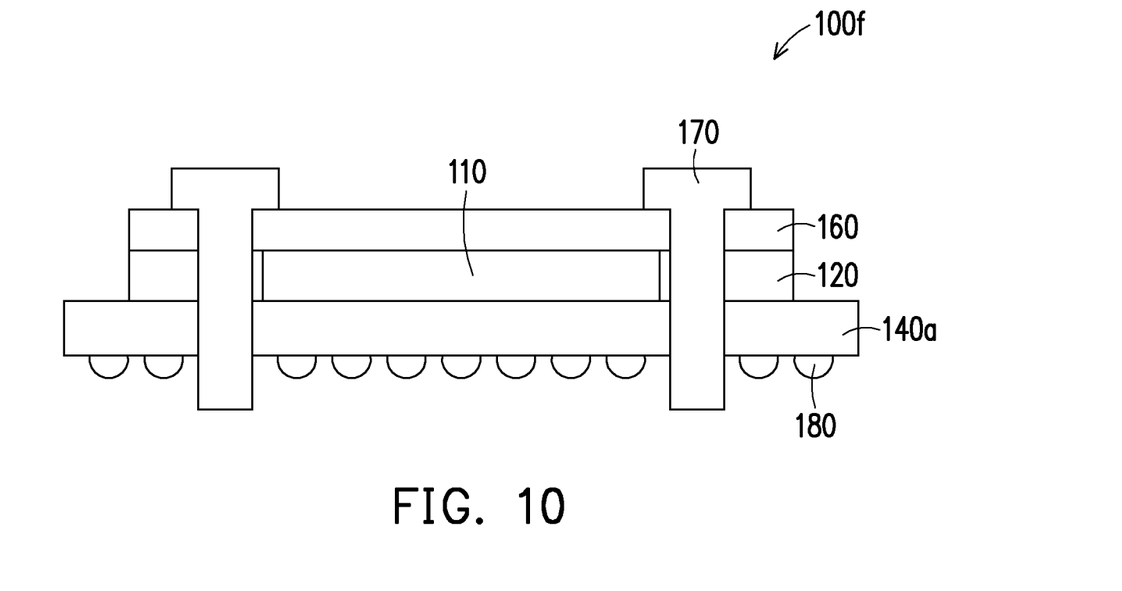
FIG. 10 illustrates a schematic cross sectional view of a semiconductor package in accordance with some embodiments.

FIG. 9 illustrates a schematic exploded view of a semiconductor package in accordance with some embodiments. FIG. 10 illustrates a schematic cross sectional view of a semiconductor package in accordance with some embodiments. It is noted that the semiconductor package 100f shown in FIG. 9 and FIG. 10 contain many features same as or similar to the semiconductor package 100 disclosed earlier with FIG. 1 and FIG. 2. For purpose of clarity and simplicity, detail description of same or similar features may be omitted, and the same or similar reference numbers denote the same or like components. The main differences between the semiconductor package 100f shown in FIG. 9 and FIG. 10 and the semiconductor package 100 shown in FIG. 1 and FIG. 2 are described as follows.

With now reference to FIG. 9 and FIG. 10, in accordance with some embodiments of the disclosure, the semiconductor package 100f further includes a heat sink 160 and a plurality of locking components 170. The heat sink 160 is disposed over the upper surface of the encapsulating material 120 and the upper surface of the semiconductor device 110. The locking components 170 may be, for example, screws, and configured to extend through the heat sink 160, the encapsulating material 120 and the redistribution structure 140a to lock them together. In one of the implementations, the chamfers 112 of the semiconductor device 110 are concaves (e.g. reverse rounding corners) located at the corner of the semiconductor device 110 and are dented toward a center of the semiconductor device 110. As such, the locking components 170 extending through the encapsulating material 120 are at least partially located in the chamfers (concave) 112 respectively as it is shown in FIG. 9. Thereby, the components (e.g. the heat sink 160, the encapsulating material 120 and the redistribution structure 140a) of the semiconductor package 100f can be locked together through the locking components 170, and the size of the semiconductor package 100f may be further reduced since the locking components 170 are at least partially located in the chamfers (concave) 112. Accordingly, the space utilization of the semiconductor package 100 can be improved and the size of the semiconductor package 100 can be more compact.

In accordance with some embodiments of the disclosure, the redistribution structure 140a may be a printed circuit board. In some embodiments, the encapsulating material 120 may be a molding compound encapsulating the semiconductor device 110, and the resultant structure (e.g. an encapsulated semiconductor device) can be mounted on the redistribution structure 140a through the locking components 170. In other embodiments, the redistribution structure 140a may be a RDL structure, which includes at least one redistribution circuit layer and at least one of dielectric layer disposed alternately with each other. In such embodiments, the redistribution structure 140a may be formed on the encapsulated semiconductor device by forming redistribution circuit layers and dielectric layers alternately through semiconductor manufacturing process.

Figure 11:
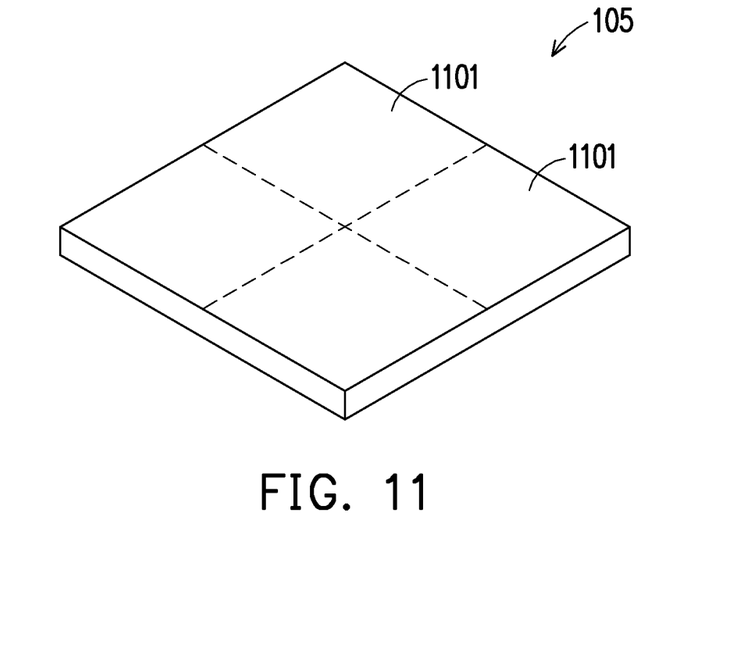
FIG. 11 and FIG. 12 illustrates schematic views of intermediate stages of a process of dicing a semiconductor device in accordance with some embodiments.
Figure 12:
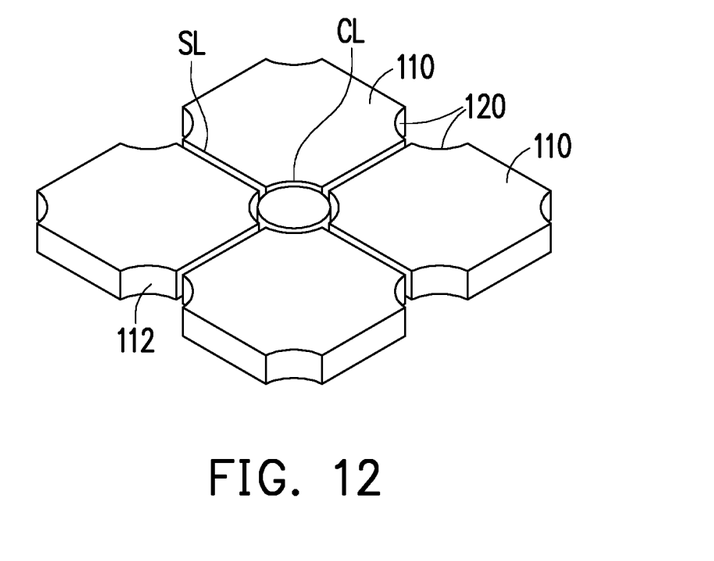

FIG. 11 and FIG. 12 illustrates schematic views of intermediate stages of a process of forming a semiconductor device in accordance with some embodiments. In accordance with some embodiments of the disclosure, the semiconductor device (e.g. semiconductor device 110) with at least one chamfer (e.g. chamfer 112) described above can be form by the following steps. With now reference to FIG. 11, a wafer 105 including a plurality of semiconductor device units 1101 connecting to one another is provided. Each of the semiconductor device units 1101 may include one semiconductor device, e.g. the semiconductor device 110, but not limited thereto. The wafer 105 undergoes many microfabrication process steps such as etching, deposition of various materials, photolithographic patterning, etc., to form the semiconductor device units 1101 connecting to one another. Then, the semiconductor device units 1101 are separated (dicing) and packaged to form a plurality of semiconductor devices (e.g. the semiconductor device 110, but not limited thereto). The process described below are the method for dicing the wafer 105 to form the semiconductor devices 110. In some embodiments, four of the semiconductor device units 1101 are illustrated in FIG. 11 to FIG. 14, but the disclosure is not limited thereto.

In accordance with some embodiments of the disclosure, the resultant structure shown in FIG. 12 can be formed by forming a chamfer cut CL at each of the semiconductor device units 1101, and dicing along a plurality of scribing lines SL of the semiconductor device units 1101 to form a plurality of semiconductor devices 110 independent from one another. In some embodiments, the step of forming the chamfer cuts CL and the step of dicing the semiconductor device units 1101 along the scribing lines SL may be performed simultaneously by a patterning process such as laser scribing process, a plasma etching process, or the like. In some embodiments, the scribing lines SL may be borderlines of each of the semiconductor device units 1101. In the present embodiments, the chamfers 112 are concaves at the corners of the semiconductor devices 110, so the chamfer cuts CL for forming the chamfer 112 may be a plurality of circular cuts at the intersections of the scribing lines (borderlines) SL of the semiconductor device units 1101. In other words, each of the chamfer cuts CL may be a curvy line at a corner of each of the semiconductor device units 1101. However, the present embodiment is merely for illustration, the locations and the shapes of the chamfer cuts CL can be modified according to the locations and the shapes of the chamfers 112. In some embodiments, the scribing lines SL are straight lines, and one of the scribing lines SL connects the chamfer cut CL at each of the semiconductor device units 1101. In some embodiments, the scribing lines SL may not cross over (extend through) the chamfer cuts CL, but the disclosure is not limited thereto. As such, the plurality of semiconductor devices 110 with the chamfers 112 can be formed, but the disclosure is not limited thereto. It should be understood that the dicing process described above may also be applied to the semiconductor devices 110a, 110b, 110c with chamfers 112, 112a, 112b, or other suitable semiconductor devices with chamfers.

Figure 13:
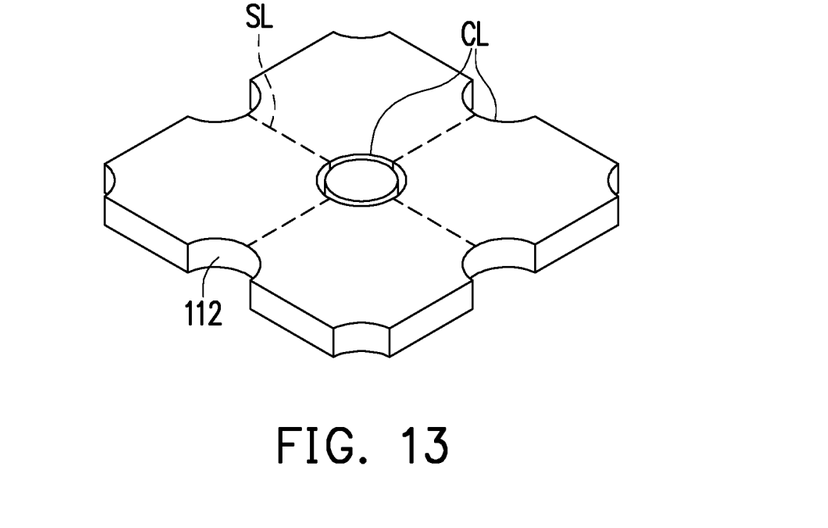
FIG. 13 and FIG. 14 illustrates schematic views of intermediate stages of a process of dicing a semiconductor device in accordance with some embodiments.
Figure 14:
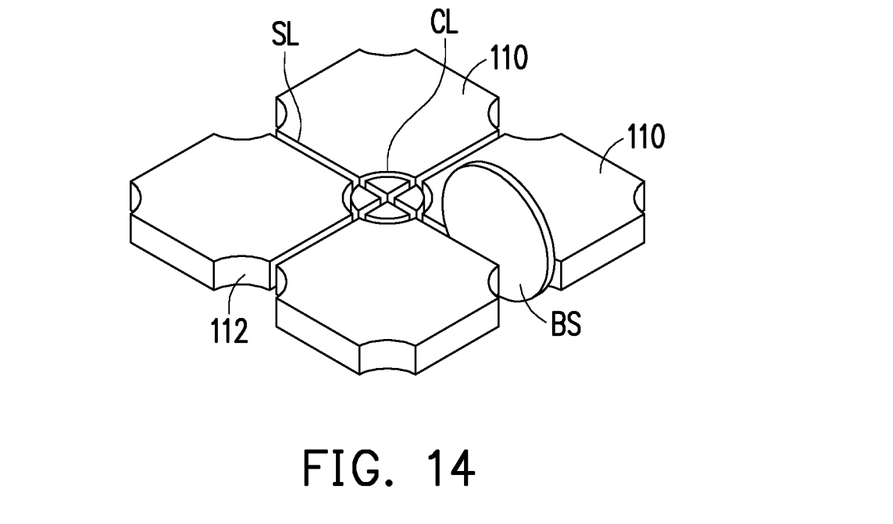

FIG. 13 and FIG. 14 illustrates schematic views of intermediate stages of a process of dicing a semiconductor device in accordance with some embodiments. In accordance with some embodiments of the disclosure, with now reference to FIG. 13 and FIG. 14, the step of forming the chamfer cuts CL and the step of dicing along the scribing lines SL may be performed in different period. For example, in one of the implementations, the step of forming the chamfer cuts CL is performed prior to the step of dicing along the scribing lines SL. That is to say, the chamfer cuts CL can be firstly formed by a patterning process, such as a laser scribing process, a plasma etching process, or the like. Then, dicing along the scribing lines SL can then be performed by a blade BS, for example. In the present embodiments, the chamfers 112 are concaves at the corners of the semiconductor devices 110, so each of the chamfer cuts CL may be a curvy line at a corner of each of the semiconductor device units 1101, but the disclosure is not limited thereto. The locations and the shapes of the chamfer cuts CL can be modified according to the locations and the shapes of the chamfers 112. In some embodiments, the scribing lines SL are straight lines, and one of the scribing lines SL cross over (extend through) the chamfer cut CL at each of the semiconductor device units 1101. In some embodiments, the chamfer cut CL and the scribing lines are formed by different processes. For example, the chamfer cuts CL are formed by laser cutting or plasma etching, and the scribing lines are diced by the blade BS. Namely, the curvy cuts are formed by a patterning process such as laser cutting or plasma etching process, and the straight lines are scribed (diced) by the blade BS, for example. As such, the plurality of semiconductor devices 110 with the chamfers 112 can be formed, but the disclosure is not limited thereto. It should be understood that the dicing process described above may also be applied to the semiconductor devices 110a, 110b, 110c with chamfers 112, 112a, 112b, or other suitable semiconductor devices with chamfers.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a semiconductor device, an encapsulating material, and a redistribution structure. The semiconductor device includes a chamfer disposed on one of a plurality of side surfaces of the semiconductor device. The encapsulating material encapsulates the semiconductor device. The redistribution structure is disposed over the encapsulating material and electrically connected to the semiconductor device.

In accordance with some embodiments of the disclosure, a semiconductor package includes a semiconductor device, an electrical component, an encapsulating material, and a redistribution structure. The semiconductor device includes a concave disposed on one of a plurality of side surfaces of the semiconductor device. The electrical component is disposed on a side of the semiconductor device and at least partially located in the concave. The encapsulating material encapsulates the semiconductor device and the electrical component. The redistribution structure is disposed over the encapsulating material and electrically connected to the semiconductor device and the electrical component.

In accordance with some embodiments of the disclosure, a method of forming a semiconductor device includes the following steps. A wafer including a plurality of semiconductor device units connecting to one another is provided. A chamfer cut is formed at each of the plurality of semiconductor device units. The plurality of semiconductor device units are diced along a plurality of scribing lines to form a plurality of semiconductor devices independent from one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor device comprising a concave disposed on one of a plurality of side surfaces of the semiconductor device and extending through the semiconductor device;
a connection component at least partially located in the concave; and
an encapsulating material fully encapsulating sidewalls of the semiconductor device and the connection component, wherein the encapsulating material is in contact with a sidewall of the concave, and the connection component is spaced apart from the concave by the encapsulating material, and physically separate from the semiconductor device.

2. The semiconductor package as claimed in claim 1, wherein the encapsulating material encapsulating the concave.

3. The semiconductor package as claimed in claim 1, wherein the connection component comprises an electrical component, and the encapsulating material encapsulating the electrical component.

4. The semiconductor package as claimed in claim 1, further comprising a redistribution structure disposed over the encapsulating material and electrically connected to the semiconductor device.

5. The semiconductor package as claimed in claim 4, wherein the redistribution structure comprises a circuit board.

6. The semiconductor package as claimed in claim 5, wherein the encapsulating material comprises a molding compound, and an upper surface of the encapsulating material is substantially coplanar with an upper surface of the semiconductor device.

7. The semiconductor package as claimed in claim 6, further comprising a heat sink disposed over the upper surface of the encapsulating material and the upper surface of the semiconductor device and the connection component comprises a plurality of locking components extending through the heat sink, the encapsulating material and the redistribution structure and located in the concave.

8. The semiconductor package as claimed in claim 4, wherein the encapsulating material comprises an underfill encapsulating at least a part of the plurality of side surfaces and filling between the semiconductor device and the redistribution structure.

9. The semiconductor package as claimed in claim 4, wherein the redistribution structure comprises a redistribution circuit layer and a dielectric layer disposed alternately with each other.

10. The semiconductor package as claimed in claim 1, wherein the semiconductor device comprises a plurality of semiconductor devices arranged in a side by side manner, and the concaves of the plurality of semiconductor devices face each other and jointly define a receiving space for receiving the connection component therein.

11. A semiconductor package, comprising:
a semiconductor device comprising a concave disposed on one of a plurality of side surfaces of the semiconductor device;
an electrical component disposed on a side of the semiconductor device and at least partially located in the concave;
an encapsulating material encapsulating the semiconductor device and the electrical component, wherein the encapsulating material is in contact with a sidewall of the concave, and the electrical component is spaced apart from the concave by the encapsulating material;
a redistribution structure disposed over the encapsulating material and electrically connected to the semiconductor device and the electrical component.

12. The semiconductor package as claimed in claim 11, wherein the concave is disposed at a corner of the semiconductor device and connected between adjacent two of the plurality of side surfaces of the semiconductor device.

13. The semiconductor package as claimed in claim 11, wherein the semiconductor device comprises a plurality of semiconductor devices arranged in a side by side manner, the concaves of adjacent two of the semiconductor devices are corresponding to each other and jointly define a receiving space, and the electrical component is disposed in the receiving space.

14. The semiconductor package as claimed in claim 11, wherein the electrical component comprises a passive device, an electrical interconnect, or an optical device.

15. The semiconductor package as claimed in claim 11, wherein the redistribution structure comprises a redistribution circuit layer and a dielectric layer disposed alternately with each other.

16. A semiconductor package, comprising:
- a semiconductor device comprising a concave disposed at a corner of the semiconductor device from a top view and extends from an upper surface of the semiconductor device to a lower surface of the semiconductor device;
- an electrical component disposed at the corner of the semiconductor device and at least partially located in the concave; and
- an encapsulating material encapsulating the semiconductor device and the electrical component, wherein the encapsulating material is in contact with a sidewall of the concave, and the electrical component is spaced apart from the concave by the encapsulating material; and
- a redistribution structure disposed over the encapsulating material and electrically connected to the semiconductor device and the electrical component.

17. The semiconductor package as claimed in claim 16, wherein the chamfer comprises a bevel corner or a rounding corner connected between adjacent two of the plurality of side surfaces of the semiconductor device.

18. The semiconductor package as claimed in claim 16, wherein the encapsulating material comprises an underfill encapsulating at least a part of the plurality of side surfaces and filling between the semiconductor device and the redistribution structure.

19. The semiconductor package as claimed in claim 16, wherein the encapsulating material comprises a molding compound, and an upper surface of the encapsulating material is substantially coplanar with an upper surface of the semiconductor device.

20. The semiconductor package as claimed in claim 16, wherein the chamfer is a concave.

* * * * *